(12) United States Patent
Heikkinen et al.

(10) Patent No.: US 10,091,887 B2
(45) Date of Patent: Oct. 2, 2018

(54) MULTI-MATERIAL STRUCTURE WITH EMBEDDED ELECTRONICS

(71) Applicant: Tacto Tek Oy, Kempele (FI)

(72) Inventors: Mikko Heikkinen, Oulu (FI); Jarmo Saaski, Kempele (FI)

(73) Assignee: TACTOTEK OY, Oulunsalo (FI)

( * ) Notice: Subject to any disclaimer, the term of this patent is extended or adjusted under 35 U.S.C. 154(b) by 189 days.

(21) Appl. No.: 14/677,062

(22) Filed: Apr. 2, 2015

(65) Prior Publication Data

US 2016/0295702 A1 Oct. 6, 2016

(51) Int. Cl.
| | |
|---|---|
| *H05K 1/18* | (2006.01) |
| *H05K 1/02* | (2006.01) |
| *H05K 3/12* | (2006.01) |
| *H05K 3/32* | (2006.01) |
| *H05K 3/28* | (2006.01) |

(52) U.S. Cl.
CPC ............ *H05K 1/186* (2013.01); *H05K 1/028* (2013.01); *H05K 1/0274* (2013.01); *H05K 1/0298* (2013.01); *H05K 1/189* (2013.01); *H05K 3/12* (2013.01); *H05K 3/32* (2013.01); *H05K 3/284* (2013.01); *H05K 2201/0129* (2013.01); *H05K 2201/10106* (2013.01); *H05K 2201/10121* (2013.01); *H05K 2203/1316* (2013.01); *H05K 2203/1327* (2013.01)

(58) Field of Classification Search
None
See application file for complete search history.

(56) References Cited

U.S. PATENT DOCUMENTS

| | | |
|---|---|---|
| 2007/0121326 A1 | 5/2007 | Nall et al. |
| 2008/0220549 A1 | 9/2008 | Nall et al. |
| 2008/0282540 A1 | 11/2008 | Singleton |

(Continued)

FOREIGN PATENT DOCUMENTS

| | | |
|---|---|---|
| EP | 1657758 | 5/2006 |
| WO | 2014037621 | 3/2014 |

OTHER PUBLICATIONS

International Search Report PCT/FI2016/050205 dated Jul. 18, 2016.

*Primary Examiner* — Elmito Breval
(74) *Attorney, Agent, or Firm* — Robert P. Michal, Esq.; Carter, DeLuca, Farrell & Schmidt, LLP (57) ABSTRACT

A multilayer structure for an electronic device, includes a flexible substrate film (202, 502) for accommodating electronics, a number of electronic components (308, 508) provided on a first surface area (401A, 501A) of the film, the film also including a second surface area adjacent (401B, 501B) to the first surface area, and a number of conductive traces (412, 512) printed on the substrate film for electrically connecting electronic components together, wherein the number of electronic components and the related first surface area of the substrate accommodating the components have been overmolded with first thermoplastic material (306, 506), the adjacent second surface area and at least part of the first area being overmolded with second thermoplastic material so that at least part of the electronic components and the first thermoplastic material thereon are substantially embedded between the substrate film and second thermoplastic material. A corresponding method of manufacture is presented.

12 Claims, 4 Drawing Sheets

(56) References Cited

U.S. PATENT DOCUMENTS

| | | |
|---|---|---|
| 2009/0111393 A1 | 4/2009 | Scalisi et al. |
| 2009/0154182 A1 | 6/2009 | Veenstra et al. |
| 2012/0106095 A1* | 5/2012 | Daniel ................ H05K 1/0283 361/746 |
| 2012/0248616 A1 | 10/2012 | Kitajima et al. |
| 2013/0176689 A1* | 7/2013 | Nishimura ............ H05K 3/284 361/739 |
| 2013/0242381 A1* | 9/2013 | Pudleiner ................ B32B 27/08 359/359 |
| 2013/0336004 A1 | 12/2013 | Mulder et al. |
| 2014/0036428 A1 | 2/2014 | Leong et al. |
| 2014/0065389 A1* | 3/2014 | Loy .................... H01L 21/2007 428/214 |
| 2014/0098505 A1 | 4/2014 | Baker |
| 2014/0305900 A1* | 10/2014 | Rogers ............... H05K 13/0023 216/13 |

\* cited by examiner

PRIOR ART

MULTI-MATERIAL STRUCTURE WITH EMBEDDED ELECTRONICS

FIELD OF THE INVENTION

Generally the present invention relates to electronics, associated devices, structures and methods of manufacture. In particular, however not exclusively, the present invention concerns integration of electronics with different plastic host materials.

BACKGROUND

Generally there exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly to the associated substrate. The term "printed" refers in this context to various printing techniques capable of producing electronics/electrical elements, including but not limited to screen printing, flexography, and inkjet printing, through substantially additive printing process. The used substrates may be flexible and printed materials organic, which is however, not necessarily always the case.

For example, the aforementioned wearable electronics and generally wearable technology such as smart clothing fuses textiles, other wearable materials and electronic devices to make a wearer's life easier by implementing different aspects of ubiquitous computing for both private and business purposes in wearable items such as garments. Recent advancements in material technology and miniaturization have brought forward solutions that the users have only dreamed about a decade or two ago. Hard shell wearable technology such as various smart watches or generally wristop devices has been limitedly available for some time now starting from the 80's wristop calculator watches evolving into sports/fitness computers, activity monitors and most recently, various communications-enabled apparatuses approaching e.g. cell phones and tablets in terms of embedded features. Yet, few wearable smartglasses and e.g. personal security—related products have hit the markets since. Actual e-textiles or 'smart textiles' have also been introduced during the last few years with reference to fabrics that provided for integration with electronics, such as sensory integration. The e-textiles may incorporate both electrically conductive materials, such as conductive yarn, and insulating materials for providing the desired electrical properties to the components embedded therewithin.

Figure 1:
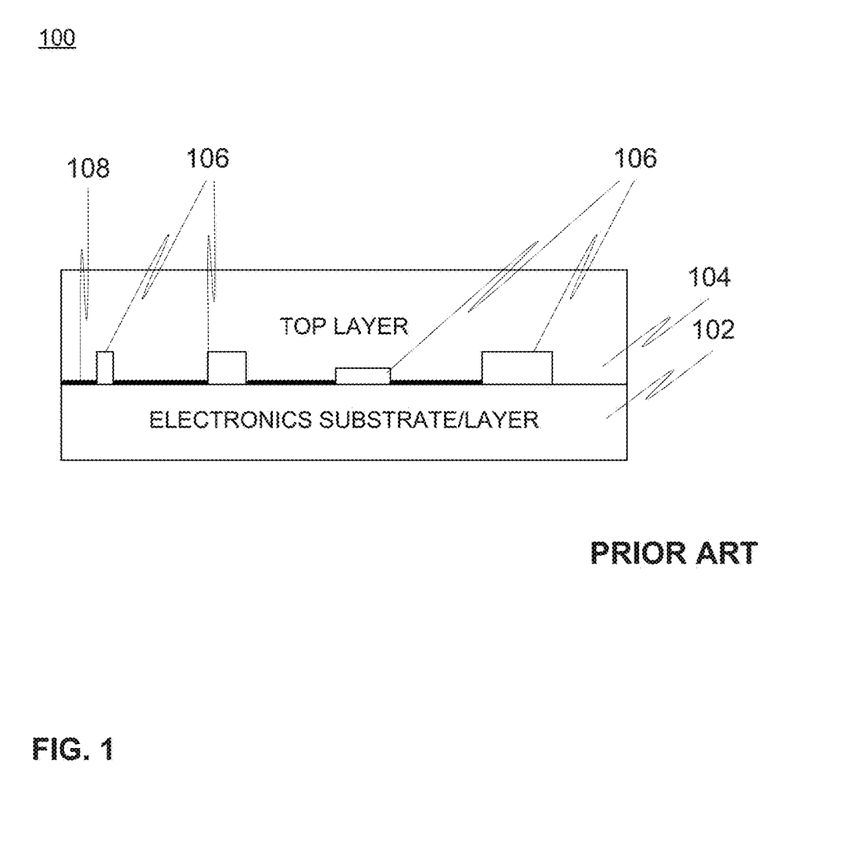
FIG. 1 illustrates one example of a prior art multilayer structure.

FIG. 1 illustrates one typical example of a multilayer construction 100 integrating and embedding electronics. A substrate 102 has been provided with a number of electronic components 106 and conductor traces 108 between them. Conductive contact points may have been established on the substrate for at least electrically connecting the provided components 106 to traces 108 and other elements of the substrate. A further material layer 104 has been provided on top using a suitable lamination method incorporating the use of e.g. adhesives, elevated temperatures and/or pressure.

The obtained structure 100 of the shown type may, notwithstanding the many benefits it undoubtedly has in terms of integration and protection, easily turn out sub-optimum having regard to one or more other important aspects affecting its usability, certainly still depending on the particular use scenario in question.

For instance, the stacked structure 100 may eventually appear too stiff or correspondingly, too flexible, as the elasticity of the structure heavily depends on the used materials 102 and 104, the properties of which are for their part, however, typically relatively straightforwardly dictated by the characteristics of the provided components 106, conductors 108 between them and the desired functionality of the components 106 in the established structure. Indeed, the preferred electronics 106, 108 may have been originally designed to function properly only in certain conditions and to withstand only a limited manipulation, e.g. flexure, implying either absolutely necessary or at least highly advantageous environmental operation parameters. Therefore, the material properties of the surrounding, electronics-embedding materials have been selected to meet the expectations determined by the electronics. Meanwhile, from the general standpoint the resulting material characteristics have actually provided disappointing side effects as to the elasticity, tactile, optical and/or aesthetic properties of the overall construction 100, for example.

SUMMARY

The objective of the present invention is to at least alleviate one or more of the above drawbacks associated with the existing solutions in the context of stacked structures and electronics included therein.

The objective is achieved with embodiments of a multilayer structure and related method of manufacture in accordance with the present invention.

According to one aspect of the present invention, a multilayer structure for an electronic device, comprises a flexible substrate film for accommodating electronics, a number of electronic components provided on a first surface area of the film, said film also comprising second surface area adjacent to the first surface area, and a number of conductive traces, such as contact pads and conductors, printed on the substrate film for electrically connecting said electronic components together and/or to target areas, such as the periphery of the substrate, wherein said number of electronic components and the related first surface area of the substrate accommodating the components have been overmolded with first thermoplastic material, the adjacent second surface area and preferably at least part of the first area further being overmolded with second thermoplastic material so that at least part of the electronic components and said first thermoplastic material thereon are substantially embedded between the substrate film and second thermoplastic material.

Preferably, only the first surface area (and related components) has been overmolded in the above by the first thermoplastic material. The first thermoplastic material has been used to overmold exclusively the first surface area so that the adjacent second surface area has remained free from the first material (or at least first material overmolded together with the first area and related components). The second surface area is still covered by the second thermoplastic material that also preferably covers at least part of the first overmolded area. On the second surface area, the second thermoplastic material may thus contact the substrate and e.g. electronic components and/or traces thereon.

In one embodiment, the number of electronic components includes at least one optoelectronic component. The at least one optoelectronic component may include a LED (light-emitting diode), an OLED (organic LED), or some other light-emitting component, for example. The components may be side-emitting ('side shooting'). Alternatively or additionally, it may include light-receiving or light-sensitive component such as a photodiode, photoresistor, other photodetector, or e.g. a photovoltaic cell. The optoelectronic component such as OLED may have been printed on the substrate film using a preferred method of printed electronics technology.

In one other, either supplementary or alternative, embodiment, the first (thermo)plastic material comprises optically substantially transparent or translucent material enabling e.g. visible light to pass through it with negligible loss. The sufficient transmittance at desired wavelengths may be about 85%, 90% or 95% or higher, for example. The second (thermo)plastic material may be substantially opaque or translucent. In some embodiments, also the second material may be transparent.

In a further, either supplementary or alternative, embodiment the substrate film may at least partially be optically substantially opaque or at least translucent having regard to predefined wavelengths e.g. in visible spectrum. The film may have been initially provided with visually distinguishable, decorative/aesthetic and/or informative, features such as graphical pattern thereon. The features may have been provided on the same side of the film with the electronics so that they have been also sealed by the overmolded one or two (at least the second) plastic materials.

Accordingly, IML (in-mold labeling) or IMD (in-mold decoration) technique may be thus applied in the manufacturing phase. The substrate film may be at least partially, i.e. at least in places, optically transparent or translucent to radiation such as visible light emitted by the electronics thereon, optionally via the first thermoplastic material. The transmittance may be about 85%, 90%, 95% or higher, for example.

In a further, either supplementary or alternative, embodiment the molded first thermoplastic material may establish a filling material of a substantially transparent or translucent window or other optical feature at least partially defined by the substrate film. The first material may be configured to convey light emitted by the electronics to the environment via the window, and/or vice versa. The substrate film may define a cut, notch, (through-)hole, or beveling for improving the light transmittance from and/or to the first plastic material having regard to the environment.

According to one other aspect, a method for manufacturing a multilayer structure for an electronic device, comprises obtaining a flexible substrate film for accommodating electronics, printing a number of conductor traces on the film for electrically connecting electronic components with each other and/or a number of predefined areas on the substrate, providing a number of electronic components on a first surface area of the film, wherein the film comprises also second surface area adjacent to the first surface area, molding first thermoplastic material on said number of electronic components and the related first area of the substrate accommodating the components, and molding second thermoplastic material on the adjacent second surface area and on at least part of the first surface area so that at least part of the electronic components and first thermoplastic material thereon are substantially embedded between the substrate film and the second thermoplastic material.

The applicable molding methods include injection molding, for instance. The first and second plastic materials may be molded using a two-shot or generally multi-shot molding method. A molding machine with multiple molding units may be utilized. Alternatively, multiple machines or a single re-configurable machine could be used for sequentially providing the two materials.

The previously presented considerations concerning the various embodiments of the structure may be flexibly applied to the embodiments of the method mutatis mutandis, and vice versa, as being appreciated by a skilled person.

The utility of the present invention arises from a plurality of issues depending on the embodiment. The obtained multilayer structure may be used to establish a desired device or module in a host element such as an intelligent garment (e.g. shirt, jacket, or trousers, or e.g. a compression garment), other piece of wearable electronics (e.g. wristop device, headwear, or footwear), vehicle, personal communications device (e.g. smartphone, phablet or tablet) or other electronics. As the first and second molded materials may exhibit certain preferred properties that may differ from each other, the resulting overall structure may be better optimized for each use scenario involving different forces or generally effects subjected to the embedded electronics and the materials in general. The integration level of the obtained structure may be high and desired dimensions such as the thickness thereof small.

The used substrate film may contain graphics and other visually and/or tactilely detectable features thereon, whereupon the film may have aesthetic and/or informative effect in addition to hosting and protecting the electronics. The film may be translucent or opaque at least in places. It may be of desired color or comprise portions of desired color. The film may be configured to establish at least a portion of an outer surface of the associated product.

The visual features such as patterns or coloring may be provided at least on the side of the film that is facing the molded plastics so that the features remain isolated and thus protected from the environmental effects by the thickness of the film. Accordingly, different impacts, rubbing, chemicals, etc. that could easily damage e.g. painted surface features do not normally reach them. The film may be easily manufactured or processed such as cut into a desired shape with necessary characteristics such as holes or notches for exposing the underlying features such as the molded material.

The first molded thermoplastic material may be optimized for various purposes including securing electronics in view of the molding process. Yet, the first material may be configured to protect the electronics from the subsequent molding phases and e.g. environmental conditions such as moisture, heat, cold, dirt, shocks, etc. It may further have desired properties in view of light transmittance and/or elasticity, for example. In case the embedded electronics includes light- or other radiation-emitting or receiving components, the first material may have sufficient transmittance to enable light transmission therethrough.

The second molded material may be optimal having regard to other characteristics such as the overall mechanical properties required from the device. It may be, for example, more or less rigid, or elastic, than the first material. In some embodiments, the first molded material may be more rigid or stiff (less elastic) than the second molded material, which enables protecting the electronics overmolded by the first molded material from excessive bending or generally deformation, while the more flexible or elastic second molded material provides for flexibility of the overall structure that may define, for instance, at least part of a dynamically bendable flexible device such as a wearable electronic device (e.g. wristop computer device) or intelligent garment, e.g. compression garment. Yet, the second molded material may provide desired aesthetic or tactile properties to the structure by the used colors, patterns, surface forms, etc.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

FIG. 1 was already discussed hereinbefore.

Figure 2:
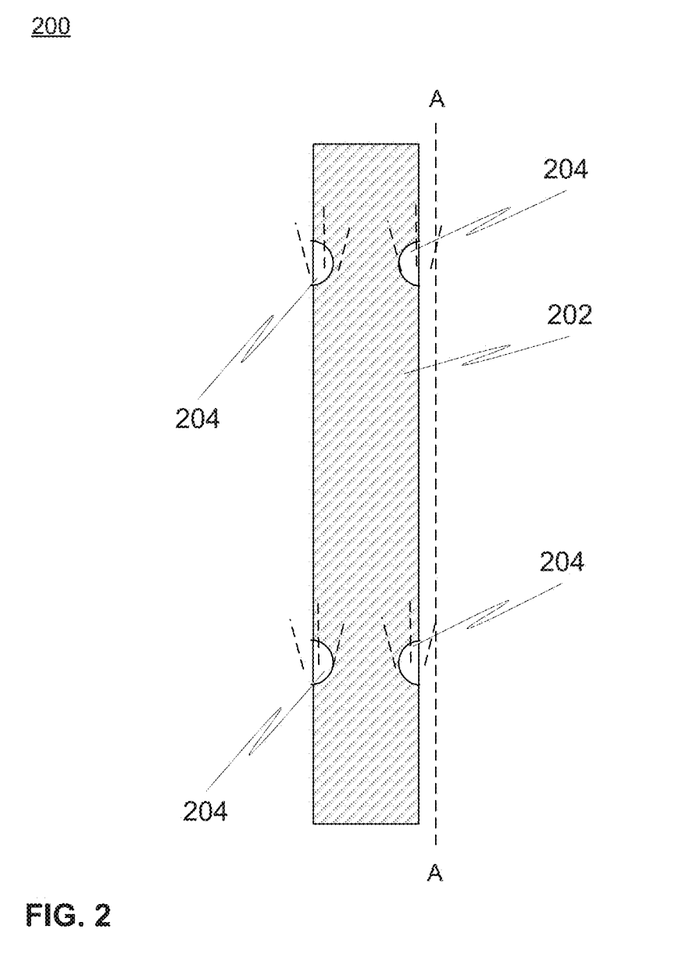
FIG. 2 is a top view of an embodiment of a multilayer structure in accordance with the present invention incorporating multiple material layers.

FIG. 2 depicts, at 200, a top view of an embodiment of a planar type multilayer structure in accordance with the present invention incorporating multiple molded material layers. A substrate 202, preferably a flexible plastic film, is shown as cut or otherwise configured into a substantially rectangular shape.

The substrate 202 is shown having a striped fill pattern, which is used to indicate potential complete or at least partial (regional) opaqueness of the substrate 202 arising from coloration and/or e.g. different graphical, alphanumeric and/or textual patterns provided on the inner surface facing the underlying molded plastic layers that are covered in more detail hereinafter with reference to FIGS. 3-5. The patterns may have been printed on the inner and/or outer surface areas of the substrate 202 using a predefined preferred paint or ink, for example.

Portions at the periphery of the substrate 202, along the longitudinal edge thereof, have been provided with transparent regions, openings, holes, notches, cuts or similar features 204 so that the light incident thereon passes through towards the upper surface (and in the depicted case, the person potentially looking at the substrate 202 and the related overall structure from the top), which is illustrated in the figure by the dotted lines emerging from the features 204. The optical transmittance of the features 204 should reach a desired predefined minimum level, e.g. 85%, 90% or 95% having regard to the wavelengths in question, typically at least visible light.

In some embodiments the substrate layer 202 may remain continuous and substantially monolithic in conjunction with the features 204, i.e. the same film 202 may also cover the feature areas 204. However, the areas of the substrate 202 defining the features 204 shall preferably exclude items such as additional matter, typically paint or ink, used elsewhere on the substrate 202 for aesthetic or e.g. informative effect as mentioned above but reducing the optical transmittance of the substrate 202.

Alternatively, the substrate 202 may indeed be shaped so as to omit any material at the location of the features 204, i.e. the substrate 202 defines notches or similar subtractive features at such locations such that the light may propagate through them substantially without any loss.

As a further alternative, the features 204 may contain material different from the surrounding substrate material. The different material may have been originally provided to the substrate 202 prior to establishing the stacked multilayer structure, or the material of the underlying molded first thermoplastic material may have entered the notch or hole defined by the substrate 202 during the molding procedure.

Multilayer structures presented herein may find use in various electronic products. For example, intelligent garment or a portable electronic apparatus such as a wristop device could be provided with an embodiment of the structure, the structure optionally forming at least part of the associated wristband.

Figure 3:
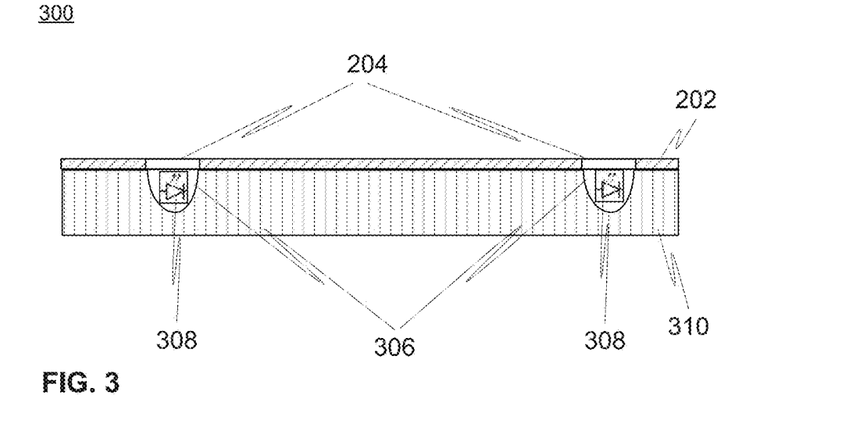
FIG. 3 depicts a side view of the embodiment of the multilayer structure of FIG. 2.

FIG. 3 shows, at 300, a possible side view (along line A-A) of the embodiment of the multilayer structure of FIG. 2. As being discussed above, the features 204 may refer to openings, notches, cuts, etc. in the substrate 204 with no substrate material or molded material, however, present therein and the gas atmosphere, in most cases air, thus filling such space. Alternatively, the features 204 may contain material that is different from the opaque, or generally less transparent, substrate material(s) used elsewhere in the substrate, and/or lack additional light-blocking or absorbing materials provided such as printed thereon including e.g. inks, paints, adhesives, etc.

Item 306 refers to the underlying thermoplastic material molded first on the substrate, i.e. temporally prior to the second material. The material 306 comprises optically substantially transparent or translucent material so as to enable the visible light and/or electromagnetic radiation at some other predefined wavelength(s) to pass through it with negligible loss. The transmittance may be at least about 80%, 85%, 90%, or 95% at those wavelength(s), for instance. The radiation/light may be emitted by the electronics 308 provided on the substrate film 202. The electronics may include e.g. a number of optoelectronic components such as LEDs (light-emitting diode). The components may be surface-mounted on the substrate film 202. Additionally or alternatively, a number of components may be manufactured by printed electronics technology.

Electrical connections between the components or between the components and e.g. external electronics disposed outside the multilayer structure may be provided by conductors and contact areas, which may be printed on the substrate by means of printed electronics. The connections may be used for power supply and signalling of control and/or other data.

Second thermoplastic material 310 may be molded on the substrate 202 already hosting the electronics 308 and first molded material 306. The second thermoplastic material 310 may thus at least partially cover the first molded material 306, embedded electronics 308 therein, and the corresponding side of the substrate film 202. At the overmolded electronics 308, the second material 310 may contact the first molded material 306. Outside the area of the first molded material 312, the second material 310 may directly contact the substrate 202.

The second thermoplastic material 310 may differ from the first material 306 in a variety of ways besides dimensions such as thickness of the material layer. It may have different elasticity, optical transparency/transmittance, glass transition temperature, and/or melting point. In the shown example, the material has been depicted using vertical stripes, which is, as was with substrate stripes, indicating the fact that the material 310 may be substantially opaque or translucent in contrast to preferably substantially transparent first material 306 illustrated without any fill pattern. Further material layers such as graphical pattern or other visually informative and/or aesthetical feature containing film may be provided on the second material 310 layer facing the environment of the structure, which may refer to surface of a host device or host user (e.g. the user's skin if the multilayer structure forms at least part of wearable electronics such as a wristop device).

Figure 4:
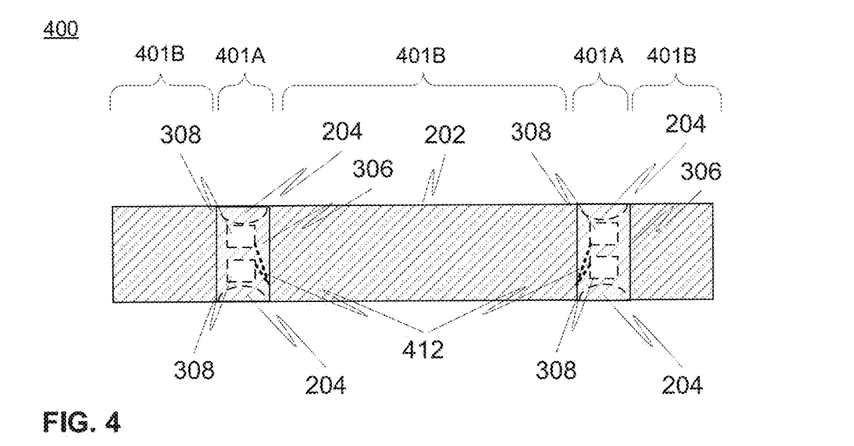
FIG. 4 is a bottom view of the substrate of the embodiment of FIG. 2 with electronics and molded first material provided thereon.

The longitudinal side view shown does not indicate any potential positioning options of the electronics 308 in transverse (lateral) direction having regard to the substrate, whereupon FIG. 4 has been drawn to clarify one, merely exemplary, scenario. FIG. 4 is thus a bottom (underside) view 400 of the substrate 202 of the embodiment of FIG. 2 with electronics and molded first material provided thereon.

First areas 401A on the bottom surface accommodate the electronics 308 overmolded with the first molded material 306 and then the second molded material 310, whereas the adjacent second areas 401B substantially exclude the first material 306 but still receive the second molded material 310 (the second molded material 310 itself being excluded from the figure for clarity purposes).

The first molded material 306 has been provided on the substrate 202 and electronics 308 as lateral strips substantially extending from one longitudinal edge of the substrate to another, each strip covering one or more (two depicted in the figure) electronic components such as LEDs 308. In other embodiments, the area provided with the first molded material 306 do not have be strips but different forms, blobs, or islets of basically any moldable shape. The components 308 may be situated in the center portion of the substrate 308 so that the components 308 are not visible and/or directly transmit light such as visible light via zero-order radiation path (without any reflections) through the features 204 that are positioned in the periphery near the substrate edges as indicated in FIG. 4 by dotted lines. Items 412 refer to aforementioned conductors and/or contact areas (e.g. contact pads) preferably printed on the substrate 202.

The shape and generally dimensions of the molded layers 306, 310 may be decided application-specifically. In FIG. 3, the molded first material layer 308 exhibits a rounded profile but e.g. a rectangular profile is possible as well.

The thickness of each molded layer 306, 310 may be few hundreds of microns or e.g. one or few millimeters. The thickness may vary. At the location of the first molded material 306, the thickness of the second material 310 may be lower than elsewhere in order to retain a desired, optionally constant, overall thickness in the structure, for example.

Accordingly, the order of magnitude of the size of the electronic components 308 may be generally similar or smaller so that the structure can host and embed them to a sufficient extent. The dimensions and thickness of the substrate film 202 may also vary from an embodiment to another. The thickness may be about 100 microns or few hundred microns, or a millimeter, for instance.

Figure 5:
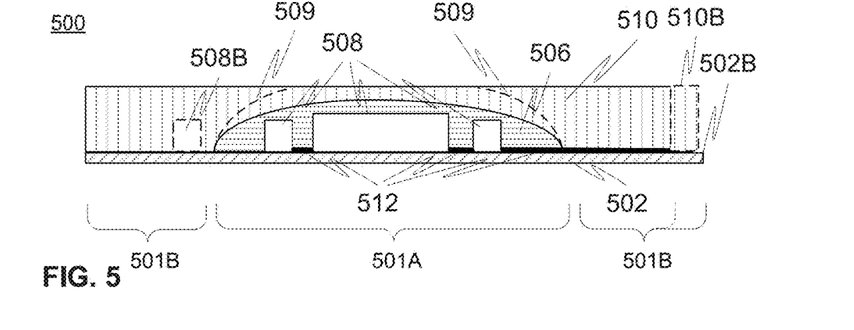
FIG. 5 illustrates a side view of one, more generally applicable, embodiment of the present invention via a cross-sectional side view.

FIG. 5 illustrates one, more generally disclosed, embodiment of the multilayer structure 500 in accordance with the present invention via a cross-sectional side view. Depending on the transparency of the used materials and the positioning of the components, the figure may also qualify as a sketch representing a standard side view as being appreciated by a person skilled in the art. The considerations set forth regarding FIGS. 3 and 4 generally apply also here and vice versa what comes to properties and configuration of different materials, dimensions, electronics, etc.

Electronics 508 including one or more components, such as passive components, active components, ICs, and/or sub-assemblies (one or more components first provided on a separate substrate, subsequently attached as a whole to the target substrate), have been provided on a on first area 501A of the substrate film, or 'sheet' or 'foil', 502 and molded within a first thermoplastic material 506 followed by molding of a second overlapping thermoplastic material 510. Some component(s) 508B may still remain on the second area(s) 501B outside the first area 501A and avoid from being overmolded with the first plastic material 506.

In some optional embodiments as indicated by numeral 502B and the dotted potentially missing/removed portion 510B of molded second material 510 thereon, one or more edges or other areas of the substrate 510 may indeed be left unmolded or the molded material may be removed therefrom afterwards so that e.g. electrical coupling to external elements is facilitated. Such portions may accommodate part of the conductors 512 for the purpose. Alternatively or additionally, the electrical coupling elements such as conductors could be funnelled from the inside of the multilayer structure 500 to the border/edge therefor in favour of external connectivity even if the substrate edge 502B was not kept free from the molded material.

Further, dotted lines/curves 509 refer to potential edges of the molded second thermoplastic material 510 in those possible embodiments wherein the second material 510 does not cover the molded first material 506, first area 501A and/or electronics 508 thereon completely, but only e.g. the border areas, as the first material 506 may itself extend from the electronics 508 and film 502 to the outer (top) surface of the structure or generally define the outer surface e.g. on the center portion of the first area 501A.

As explained hereinbefore, the molded material layers 506, 510 may have different properties and functions. The first molded material layer 506 may be configured to secure and protect the electronics 508. The layer 506 may also be optimal/optimized from the standpoint of the used molding process, preferably injection molding. Yet, optical properties such as transmittance of the material 506 may be considered.

For better protecting and accommodating the electronics, the first molded layer 506 may be less flexible or elastic than the second layer 510, for instance.

The second layer 510 may be selected based on the desired mechanical properties, such as flexibility or elasticity, and/or visual properties of the overall structure 500 and related device it at least partially establishes. The visual properties may include informative (e.g. instructive or indicative text) and aesthetic features (e.g. graphical pattern).

Having regard to the material selections, the film 502 may substantially consist of or at least comprise one material selected from the group consisting of: polymer, thermoplastic material, PMMA (Polymethyl methacrylate), Poly Carbonate (PC), polyimide, a copolymer of Methyl Methacrylate and Styrene (MS resin), glass and Polyethylene Terephthalate (PET).

In some embodiments, the substrate film 502 may include or be coated or covered by further materials/material layers at least on the side facing the environment (i.e. not the electronics and molded first and second materials). E.g. textile or biological or bio-based materials (e.g. leather, wood, paper, cardboard) in addition to or instead of more conventional layers may be provided. Also e.g. rubber or generally rubberous material may be used.

First and second thermoplastic materials may, for instance, comprise at least one material selected from the group consisting of: PC, PMMA, ABS, PET, nylon (PA, polyamide), polypropylene (PP), polystyrene (GPPS), and MS resin.

The substrate 502 may be shaped according to the requirements set by each use scenario. It 502 may exhibit e.g. a rectangular, circular, or square general shape. It may contain recesses, notches, cuts or openings for providing optical path as discussed earlier and/or e.g. access to the elements provided on the substrate 502, on either side thereof. For example, for enabling a battery replacement of embedded battery or generally component change, or for accessing a UI feature (e.g. touch-sensitive area, button or switch) the substrate 502 could be provided with a related access route.

The electronics 508 may include at least one element selected from the group consisting of: optoelectronic component, microcontroller, microprocessor, signal processor, DSP (digital signal processor), sensor, programmable logic chip, memory, transistor, resistor, capacitor, inductor, memory array, memory chip, data interface, transceiver, wireless transceiver, transmitter, receiver, wireless transmitter, and wireless receiver.

Different sensing and/or other functionalities may be implemented by the embedded ICs, dedicated components, or shared ICs/electronics (multi-purpose electronics).

The electronics 508 may include printed electronics obtained by printed electronics technology such as screen printing or ink jetting. Additionally or alternatively, the electronics 508 may include e.g. surface-mounted elements. For example, adhesive may be utilized for mechanically securing the electronics 508 on the substrate. Conductive materials such as conductive adhesive and/or solder may be applied for establishing electrical and also mechanical connections.

Figure 6:
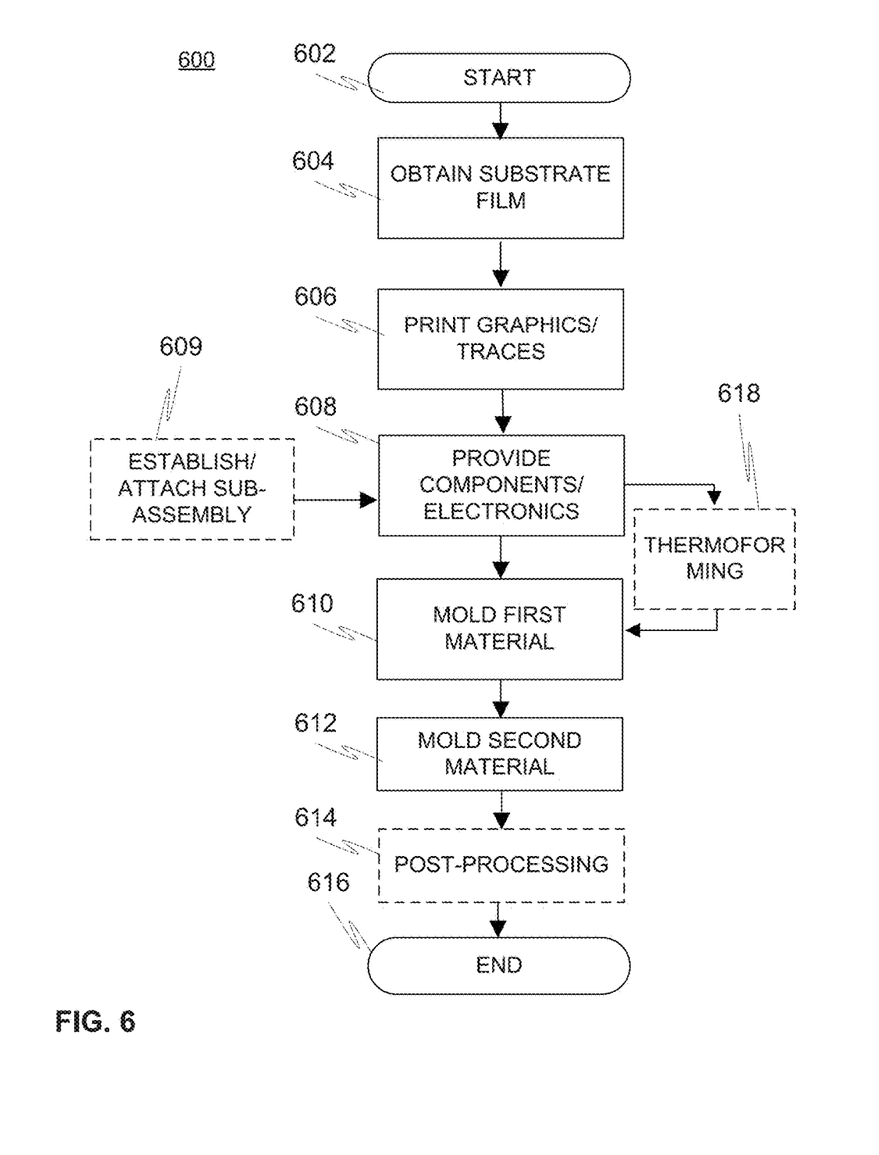
FIG. 6 is a flow diagram disclosing an embodiment of a method in accordance with the present invention.

FIG. 6 includes a flow diagram 600 disclosing an embodiment of a method in accordance with the present invention.

At the beginning of the method for manufacturing the multilayer structure, a start-up phase 602 may be executed. During start-up 602, the necessary tasks such as material, component and tools selection, acquisition, calibration and other configuration may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, thermoforming, and/or printing equipment, among others, may be thus ramped up to operational status at this stage.

At 604, at least one, preferably flexible, substrate film for accommodating electronics is obtained. A ready-made element of substrate material, e.g. roll of plastic film, may be acquired. In some embodiments the substrate film itself may be first produced in-house by molding or other methods from the desired starting material(s). Optionally, the substrate film is processed. It may be, for example, provided with openings, notches, recesses, cuts, etc. as contemplated hereinbefore.

At 606, a number of conductive elements, such as conductor traces and contact areas (e.g. pads) for electrically coupling to the electronic components are provided on the substrate, preferably by one or more techniques of printed electronics. For example, screen, inkjet, flexographic, gravure or offset lithographic printing may be utilized.

At 608, electronics are arranged on the substrate. Ready-made components such as various SMDs may be attached to the contact areas by solder and/or adhesives. Alternatively or additionally, printed electronics technology may be applied to actually manufacture at least part of the components, such as OLEDs, directly onto the film.

Item 609 refers to optional attachment of one or more sub-systems or 'sub-assemblies' that may incorporate an initially separate, secondary substrate provided with electronics such as IC(s) and/or various components. At least part or all of the electronics of the multilayer structure may be provided to the substrate film via such sub-assembly. Optionally, the sub-assembly may be at least partially overmolded by a protective plastic layer prior to attachment to the main substrate. For example, adhesive, pressure and/or heat may be used for mechanical bonding of the sub-assembly with the primary (host) substrate. Solder, wiring and conductive ink are examples of applicable options for providing the electrical connections between the elements of the sub-assembly and with the remaining electrical elements on the primary substrate. The protective plastic layer molded on the substrate and electronics of the sub-assembly may establish the first thermoplastic layer of the multilayer structure in accordance with the present invention.

In some embodiments, prior to or upon the molding phase the substrate film optionally already containing electronics may be thermoformed 618. The substrate containing thermoformable material may be shaped to better fit the target environment or target use. It may be shaped to receive e.g. human wrist, arm, leg, ankle, foot, body or head ergonomically.

At 610, the first thermoplastic layer is molded upon at least one side of the substrate film and electronics thereon, such as a number of electronic components, related traces and contact areas. As mentioned above, in some embodiments molding of the first material could take place having regard to the separate sub-assembly only prior to attaching the sub-assembly to the main substrate.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about 1 mm, but considerably thicker or thinner embodiments are also feasible.

At 612, the second plastic layer is molded on the substrate, covering the underlying first layer and electronic components at least partially.

Item 614, refers to possible post-processing tasks. Further layers may be added into the multilayer structure. The layers may be of indicative or aesthetic value and contain e.g. textile, leather or rubber materials instead of or in addition to further plastics. The structure may be installed at a host device or host element such as a piece of footwear, helmet, other garment, etc. Additional elements such as electronics may be installed at the outer surface(s) of the structure, such as the exterior surface of the substrate.

At 616, method execution is ended.

The scope of the present invention is determined by the attached claims together with the equivalents thereof. A person skilled in the art will appreciate the fact that the disclosed embodiments were constructed for illustrative purposes only, and the innovative core of the suggested solution reviewed hereinbefore will cover further embodiments, embodiment combinations, variations and equivalents that best suit each real-life use case.

For instance, in some variations of the present invention, the second molded material could be molded so that it substantially (only) neighbors the first molded material but does not cover it, i.e. the two materials are solely adjacently positioned on the substrate instead of substantial or any overlap.

The invention claimed is:

1. A multilayer structure for an electronic device, comprising:
    a flexible substrate film for accommodating electronics, the flexible substrate film having a first surface area and an adjacent second surface area;
    a number of electronic components provided on the first surface area of the flexible substrate film;
    a number of conductive traces printed on the flexible substrate film for electrically connecting the electronic components together;
    a first thermoplastic material overmolded to the number of electronic components and the related first surface area of the flexible substrate film accommodating the electronic components; and
    a second thermoplastic material overmolding the adjacent second surface area and at least part of the first surface area so that at least part of the electronic components and the first thermoplastic material thereon are substantially embedded between the flexible substrate film and the second thermoplastic material,
    wherein the first thermoplastic material exhibits a first elasticity and the second thermoplastic material exhibits a second, different elasticity, and
    wherein the first thermoplastic material is configured to prevent the first surface area of the flexible substrate from deformation and the second thermoplastic material is configured to allow the flexible substrate to be bendable.

2. The structure of claim 1, wherein the number of electronic components include at least one optoelectronic, light-emitting component.

3. The structure of claim 2, wherein the at least one optoelectronic component is a side-emitting component.

4. The structure of claim 1, wherein the first thermoplastic material exhibits lower elasticity and the second thermoplastic material exhibits higher elasticity.

5. The structure of claim 1, wherein the first thermoplastic material comprises optically transparent or translucent material having regard to predefined wavelengths including wavelengths of visible spectrum.

6. The structure of claim 1, wherein the flexible substrate film is optically opaque or translucent at least in places having regard to predefined wavelengths including wavelengths of visible spectrum.

7. The structure of claim 1, wherein the flexible substrate film comprises a graphical pattern or coloration printed thereon.

8. The structure of claim 1, wherein the flexible substrate film defines an opening through which light emitted by one or more of the electronic components is configured to propagate.

9. The structure of claim 1, wherein the flexible substrate film defines an opening through which light emitted by one or more of the electronic components and first transmitted by the first thermoplastic material is configured to propagate.

10. The structure of claim 1, wherein the second thermoplastic material comprises optically opaque or translucent material having regard to predefined wavelengths including wavelengths of visible spectrum.

11. The structure of claim 1, wherein the number of electronic components include at least one light-emitting diode.

12. The structure of claim 1, wherein the flexible substrate film comprises a graphical pattern or coloration printed on the side facing the first and second thermoplastic materials.

* * * * *